US007256485B2

(12) United States Patent
Oota

(10) Patent No.: US 7,256,485 B2
(45) Date of Patent: Aug. 14, 2007

(54) SEMICONDUCTOR DEVICE HAVING BONDING PAD OF THE FIRST CHIP THICKER THAN BONDING PAD OF THE SECOND CHIP

(75) Inventor: Mitsuru Oota, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/350,889

(22) Filed: Feb. 10, 2006

(65) Prior Publication Data

US 2006/0220231 A1 Oct. 5, 2006

(30) Foreign Application Priority Data

Mar. 18, 2005 (JP) ............................ 2005-079520

(51) Int. Cl.
*H01L 23/32* (2006.01)

(52) U.S. Cl. ...................................... 257/686; 257/777

(58) Field of Classification Search ................ 257/686, 257/723, 734, 777, 779, 781

See application file for complete search history.

(56) References Cited

U.S. PATENT DOCUMENTS 5,245,215 A * 9/1993 Sawaya ..................... 257/676

FOREIGN PATENT DOCUMENTS

| | | |
|---|---|---|
| JP | 2000-68316 | 3/2000 |
| JP | 2000-114452 | 4/2000 |
| JP | 2003-273314 | 9/2003 |

* cited by examiner

*Primary Examiner*—Hoai Pham
(74) *Attorney, Agent, or Firm*—McGinn IP Law Group, PLLC

(57) ABSTRACT

To provide a semiconductor device that enables high integration degree, and a manufacturing method therefor. A multi-chip module according to an embodiment of the present invention includes: a first semiconductor chip having a first bonding pad; a second semiconductor chip having a second bonding pad thinner than the first bonding pad; and a bonding wire connected with each of the first bonding pad and the second bonding pad, the first bonding pad being connected with a first bond side end portion of the bonding wire and the second bonding pad being connected with a second bond side end portion of the bonding wire.

16 Claims, 4 Drawing Sheets

106
104
105b
105a
104
102b
102a
103
101
100

SEMICONDUCTOR DEVICE HAVING BONDING PAD OF THE FIRST CHIP THICKER THAN BONDING PAD OF THE SECOND CHIP

BACKGROUND OF THE INVENTION

1. Field of the Invention

The present invention relates to a semiconductor device and a manufacturing method therefor. In particular, the invention relates to a semiconductor device having plural semiconductor chips and a manufacturing method therefor.

2. Description of Related Art

To keep up with recent tendencies to downsize an electronic device, there is an increasing demand to package semiconductor chips with high density or high integration degree. To that end, a multi-chip module prepared by integrating plural semiconductor chips into one package has bee developed (see Japanese Unexamined Patent Publication Nos. 2003-273314, 2000-68316, and 2000-114452, for example).

In general, the multi-chip module has plural semiconductor chips on a lead frame that are obtained by arbitrarily connecting transistors, resistors or such other elements to compose a circuit. FIG. 5 is a schematic diagram showing the structure of a conventional multi-chip module 10 where two semiconductor chips 12 are mounted on the same lead frame 11. As shown in FIG. 5, the semiconductor chips 12 are connected face up on the island of the lead frame 11 via the die mounting member 13. Formed on each of the semiconductor chips 12 are circuit wiring lines 14 and a bonding pad 15. The bonding pads 15 on the respective chips are connected with each other via a bonding wire 16.

Incidentally, in the aforementioned multi-chip module 10, the bonding pads 15 for bonding the semiconductor chips 12 through the bonding wire 16 are formed with the thickness enough to suppress damage on the semiconductor chips, for the purpose of minimizing damage on the semiconductor chips upon the bonding.

Along with recent high-density integration of semiconductor chips, there is a need to reduce a pitch of the circuit wiring lines 14, and to reduce the thickness of each circuit wiring line 14 for realizing a processing with high dimensional accuracy. However, the circuit wiring line 14 and the bonding pad 15 are formed at the same time, so if the bonding pad 15 is thick, the circuit wiring line 14 is accordingly thick. Thus, it is difficult to reduce a pitch of the circuit wiring lines 14, and to downsize the semiconductor chips 12. In addition, in the case of etching only the circuit wiring line 14, an additional step of increasing the thickness of the bonding pad 15 is required, which costs high.

SUMMARY OF THE INVENTION

A semiconductor device according to an aspect of the present invention includes: a plurality of semiconductor chips including: a first semiconductor chip having a first bonding pad; and a second semiconductor chip having a second bonding pad thinner than the first bonding pad; and a bonding wire connected with each of the first bonding pad and the second bonding pad, the first bonding pad being connected with a first bond side end portion of the bonding wire and the second bonding pad being connected with a second bond side end portion of the bonding wire. Hence, it is possible to reduce the thickness of a circuit wiring line, form circuit wiring lines at small pitches with high dimensional accuracy, and provide a semiconductor device of the high integration degree.

According to another aspect of the invention, a method of manufacturing a semiconductor device including a plurality of semiconductor chips, includes: arranging a first semiconductor chip having a first bonding pad; arranging a second semiconductor chip having a second bonding pad thinner than the first bonding pad; and bonding one end of the bonding wire to the first bonding pad and then bonding the other end of the bonding wire to the second bonding pad. Accordingly, the thickness of the circuit wiring line can be reduced without requiring an additional step of increasing the thickness of the bonding pad, and the circuit wiring lines can be formed at small pitches with high dimensional accuracy.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
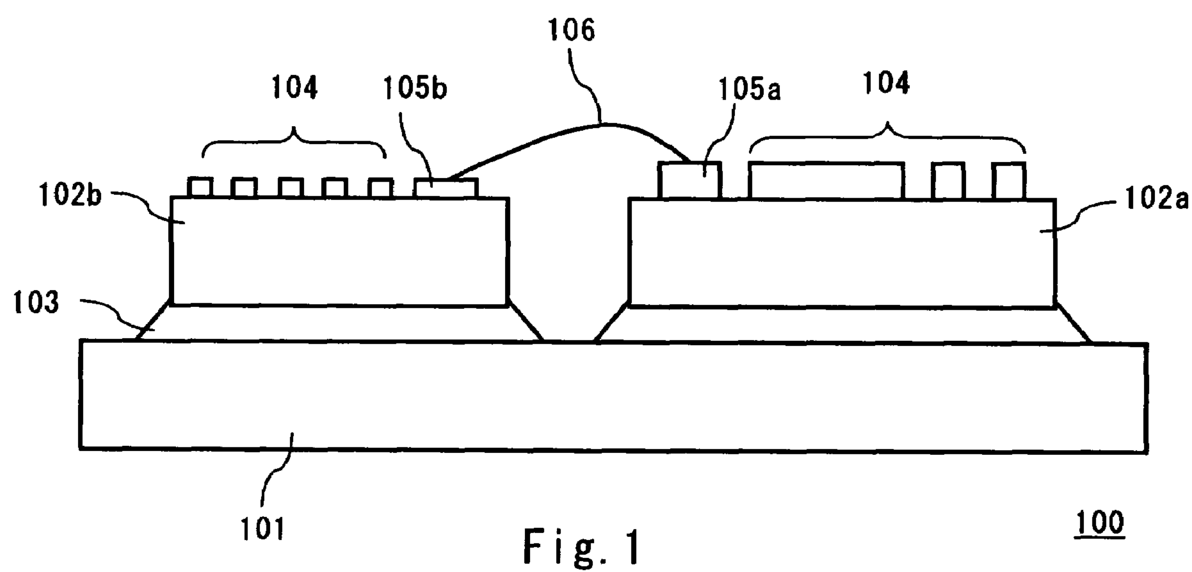
FIG. 1 is a schematic diagram showing the structure of a semiconductor device according to a first embodiment of the present invention.

Referring to FIG. 1, a semiconductor device according to a first embodiment of the present invention is described. FIG. 1 is a schematic diagram showing the structure of a multi-chip module 100 as the semiconductor device of this embodiment. As shown in FIG. 1, the multi-chip module 100 includes a lead frame 101, a first semiconductor chip 102*a*, a second semiconductor chip 102*b*, and a die mounting member 103. From now on, description is given of a case where two semiconductor chips, the first semiconductor chip 102*a* and the second semiconductor chip 102*b*, are mounted on the same lead frame 101. A feature of this embodiment resides in a bonding pad 105 used for connecting between the first semiconductor chip 102*a* and the second semiconductor chip 102*b*.

The lead frame 101 is a substrate supporting the first semiconductor chip 102*a* and the second semiconductor chip 102*b*. Formed on the lead frame 101 are islands (not shown) connected with the first semiconductor chip 102*a* and the second semiconductor chip 102*b*. The first semiconductor chip 102*a* and the second semiconductor chip 102*b* are connected face up on a corresponding island through the die mounting member 103.

The first semiconductor chip 102*a* and the second semiconductor chip 102*b* compose a circuit by arbitrarily connecting transistors, resistors, or other such elements in a previous step. Further, on the first semiconductor chip 102*a*, a circuit wiring line 104 and a first bonding pad 105*a* are formed. On the other hand, on the second semiconductor chip 102*b*, the circuit wiring line 104 and a second bonding pad 105*b* are formed. The circuit wiring line 104 and the bonding pad 105 are generally formed at the same time through the same process, for example, lithography or patterning. As a material for the bonding pad 105, a conductive material such as Al, AlSi, AlSiCu, or Cu can be used. The bonding pad 105 is described later in detail.

Further, the first bonding pad 105*a* is electrically connected with the second bonding pad 105*b* via a bonding wire 106. As a material for the bonding wire 106, Al-containing metal such as Al, AlSi, AlNi, or AlSiNi can be used. Further, the bonding pad 105 may be bonded to the bonding wire 106 based on a well-known wedge bonding method. The wedge bonding method implies a wire-bonding method using a wedge, which presses the bonding wire 106 against the bonding pad 105 with the edge of the ultrasonically vibrating wedge to bond the wire to the pad at the room temperature by means of ultrasonic vibrations under a load. Further, an Au wire may be used as the bonding wire 106 to carry out wedge bonding through low-temperature heating.

Referring now to FIGS. 2A to 2D, a method of manufacturing the semiconductor device of this embodiment is described. The bonding pad 105 is bonded to the bonding wire 106 through the above wedge bonding. For ease of explanation, the circuit wiring line 104 or the like is omitted from FIGS. 2A to 2D.

Figure 2A:
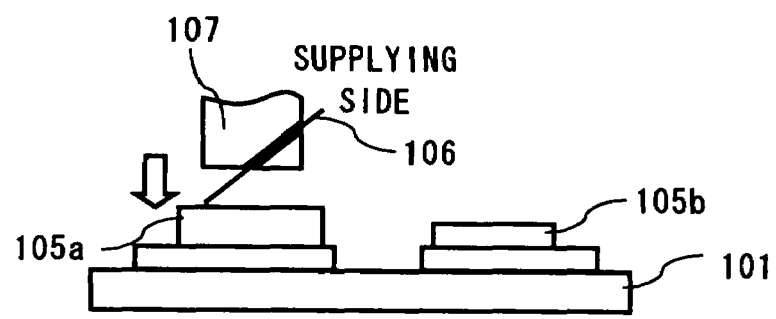
FIG. 2A illustrates a method of manufacturing the semiconductor device according to the first embodiment of the present invention.

First of all, as shown in FIG. 2A, the bonding wire 106 is previously supplied from a wire spool (not shown) up to the edge of a wedge 107. Then, the wedge 107 is moved downward to bring the bonding wire 106 into contact with the first bonding pad 105*a*. Thereafter, the wedge 107 is further moved downward to press the bonding wire 106 against the first bonding pad 105*a*.

Figure 2B:
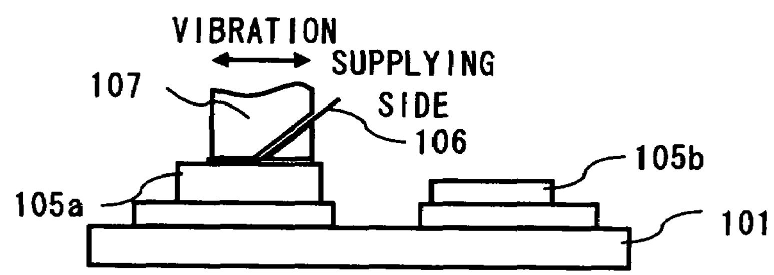
FIG. 2B illustrates a method of manufacturing the semiconductor device according to the first embodiment of the present invention.

As shown in FIG. 2B, the ultrasonic vibrations are transmitted from the wedge 107 while the bonding wire 106 is pressed against the first bonding pad 105*a* to bond the first bonding pad 105*a* to the bonding wire 106. Here, the junction between the first bonding pad 105*a* and the bonding wire 106 is referred to as a first bond. At the first bond, the tip end of the bonding wire 106 is not used for bonding with the bonding pad 105*a* but remains unused.

Figure 2C:
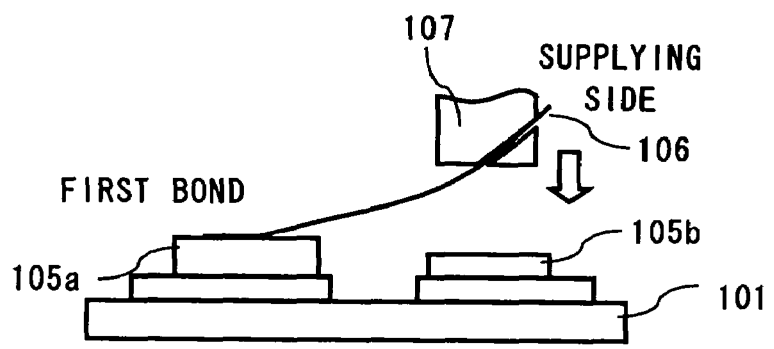
FIG. 2C illustrates a method of manufacturing the semiconductor device according to the first embodiment of the present invention.
Figure 2D:
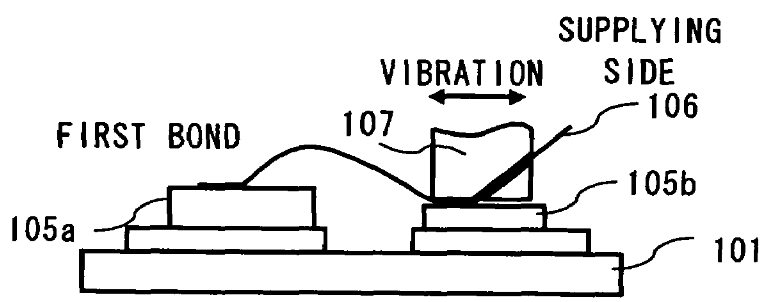
FIG. 2D illustrates a method of manufacturing the semiconductor device according to the first embodiment of the present invention.

Next, as shown in FIG. 2C, the wedge 107 is moved upward up to a position just above the second bonding pad 105*b* while the bonding wire 106 is bonded to the first bonding pad 105*a*. After that, as shown in FIG. 2D, the wedge 107 is moved downward again to press the bonding wire 106 against the second bonding pad 105*b*. In this way, the ultrasonic vibrations are applied by the wedge 107 while the bonding wire 106 is pressed to bond the second bonding pad 105*b* to the bonding wire 106. The bonding wire 106 connects between the first bonding pad 105*a* and the second bonding pad 105*b* to form a loop as mentioned above. Here, a junction between the second bonding pad 105*b* and the bonding wire 106 is referred to as a second bond. In addition, the end portion on the first bond side of the loop of the bonding wire 106 connecting between the first bonding pad 105*a* and the second bonding pad 105*b* is referred to as a first bond side end portion, and an end portion thereof on the second bond side is referred to as a second bond side end portion.

After that, the bonding wire 106 is torn off and cut. Thus, at the second bond, there is a trace of the bonding wire 106 being torn off. As described above, the bonding wire form differs between the first bond and the second bond. Hence, whether the end portion of the loop of the bonding wire 106 is on the first bond side or the second bond side can be visually checked with ease through a microscope based on the form of the bonding wire 106. After the completion of the bonding for all portions, the lead frame 101, semiconductor chips 102, and the bonding wire 106 are wholly sealed to complete a multi-chip module 100.

Hereinbelow, the bonding pad 105 of this embodiment is described. As mentioned above, the bonding pad 105 is used for electrically connecting between two semiconductor chips, the first semiconductor chip 102*a* and the second semiconductor chip.

Figure 3A:
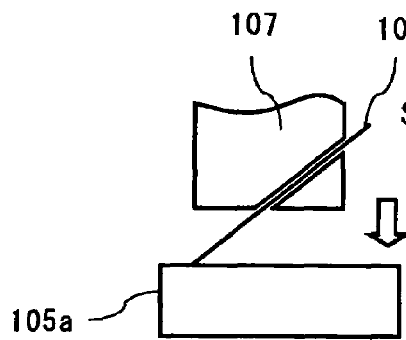
FIG. 3A illustrates how to connect a first bonding pad with a bonding wire.

As shown in FIG. 3A, in the first bonding pad 105*a* that is first bonded to the bonding wire 106, the bonding wire 106 having the free end extends from the wedge 107 with a predetermined length and comes into contact with the first bonding pad 105*a* at an angle. The bonding wire 106 has no ball at its end, and its diameter is substantially uniform. In general, an angle between the first bonding pad 105*a* and the bonding wire 106 is 45°. Subsequently, the wedge 107 is further moved downward to press an extended portion of the bonding wire 106 against the first bonding pad 105*a*. When being pressed against the bonding wire 106, the first bonding pad 105*a* is considerably damaged. At this time, if the thickness of the bonding pad 105*a* is insufficient, the semiconductor chip 102*a* may be damaged.

Figure 3B:
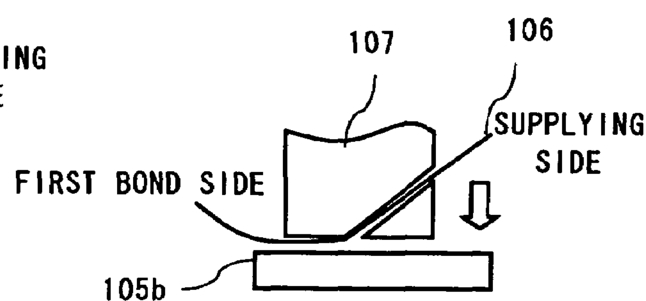
FIG. 3B illustrates how to connect a second bonding pad with a bonding wire.

On the other hand, the second bonding pad 105*b* is bonded to the bonding wire 106 after the first bonding pad 105*a* was bonded to the bonding wire 106. Accordingly, a middle portion of the bonding wire 106 comes into contact with the second bonding pad 105*b*. The bonding wire 106 connects the first bonding pad 105*a* with the second bonding pad 105*b* to form a loop, and thus is pulled upward. Hence, as shown in FIG. 3B, when coming into contact with the second bonding pad 105*b*, the bonding wire 106 is bent along the wedge 107 and extends almost in parallel to the second bonding pad 105*b*. Accordingly, a damage applied at the time when the wedge 107 moves downward to press the bonding wire 106 against the second bonding pad 105*b* is smaller than that of the first bonding pad 105*a*.

In addition, not all energy of the ultrasonic vibrations upon the bonding is used for bonding between the bonding pad 105 and the bonding wire 106; there is an energy loss at the bonding wire 106. That is, upon the first bonding operation for bonding the first bonding pad 105*a* and the bonding wire 106, the tip end of the bonding wire 106 is the free end. Accordingly, the vibration energy generated during the bonding operation is wasted only on one side of the bonding wire 106, that is, the supplying side of the bonding wire 106.

On the other hand, the second bonding pad 105*b* is bonded to the bonding wire 106 after the first bonding pad 105*a* was bonded. At this time, the bonding wire 106 is being connected with the first bonding pad 105*a*. In this state, there is a loss of the vibration energy generated during the bonding operation on both sides of the bonding wire 106, that is, the supplying side and the first bond side. Accordingly, the vibration energy used for bonding the second bonding pad 105*b* to the bonding wire 106 is smaller than that for bonding the first bonding pad 105*a*. Hence, the second bonding pad 105*b* bonded in the second bonding operation is less damaged than the first bonding pad 105*a* bonded in the first bonding operation.

Thus, after bonding the first bonding pad 105*a* with the bonding wire 106, the second bonding pad 105*b* is bonded to the bonding wire 106, whereby the second bonding pad 105*b* can be made thinner than the first bonding pad 105*a*.

On that account, if the second bonding pad 105*b* is thinner than the first bonding pad 105*a* that is first bonded, an internal circuit of the second semiconductor chip 102*b* is not so damaged as a result of bonding with the bonding wire 106. As described above, whether the first bonding pad 105*a* (or the second bonding pad 105*b*) is on the first bond side or the second bond side can be visually checked with ease through the microscope based on the form of the remaining portion of the bonding wire 106.

In this way, the bonding wire 106 is first bonded to the thick first bonding pad 105*a* and then bonded to the thin second bonding pad 105*b*. That is, the bonding wire 106 bonded to the first bonding pad 105*a* is bonded to the second bonding pad 105*b* thinner than the first bonding pad 105*a*. With such a structure, even if the second bonding pad 105*b* is thin, satisfactory bonding can be executed without damaging the semiconductor chips 102.

Further, the bonding pad 105 is generally formed concurrently with the circuit wiring line 104 through the same process. Thus, in the second semiconductor chip 102*b*, the circuit wiring line 104 to be formed together with the second bonding pad 105*b* can be formed with a smaller thickness. Accordingly, the circuit wiring lines 104 can be formed at small pitches with high dimensional accuracy to improve the integration degree of the second semiconductor chips 102*b*. Furthermore, the second semiconductor chip 102*b* can be downsized, so the size of the entire multi-chip module 100 can be reduced.

Further, in the second semiconductor chip 102*b*, it is unnecessary to form the thick second bonding pad 105*b*. Hence, a step of forming the second bonding pad 105*b* separately from the circuit wiring line 104 is unnecessary. Thus, it is possible to prevent an increase in the number of steps of the manufacturing process and to reduce a manufacturing cost.

An output chip supplies power and includes a power MOS transistor of a large current type. Therefore, the output chip is required to have thick circuit wiring lines for withstanding a large amount of current. Further, a control circuit chip is an LSI circuit chip where a logic circuit is configured. The control circuit chip is required to have thin circuit wiring lines for improving the integration degree. Accordingly, for example, the first semiconductor chip 102*a* having the thick first bonding pad 105*a* is used as the output chip that needs to have the thick circuit wiring line 104, while the second semiconductor chip 102*b* having the thin second bonding pad 105*b* is used as the control circuit chip with the high integration degree.

Second Embodiment

Figure 4:
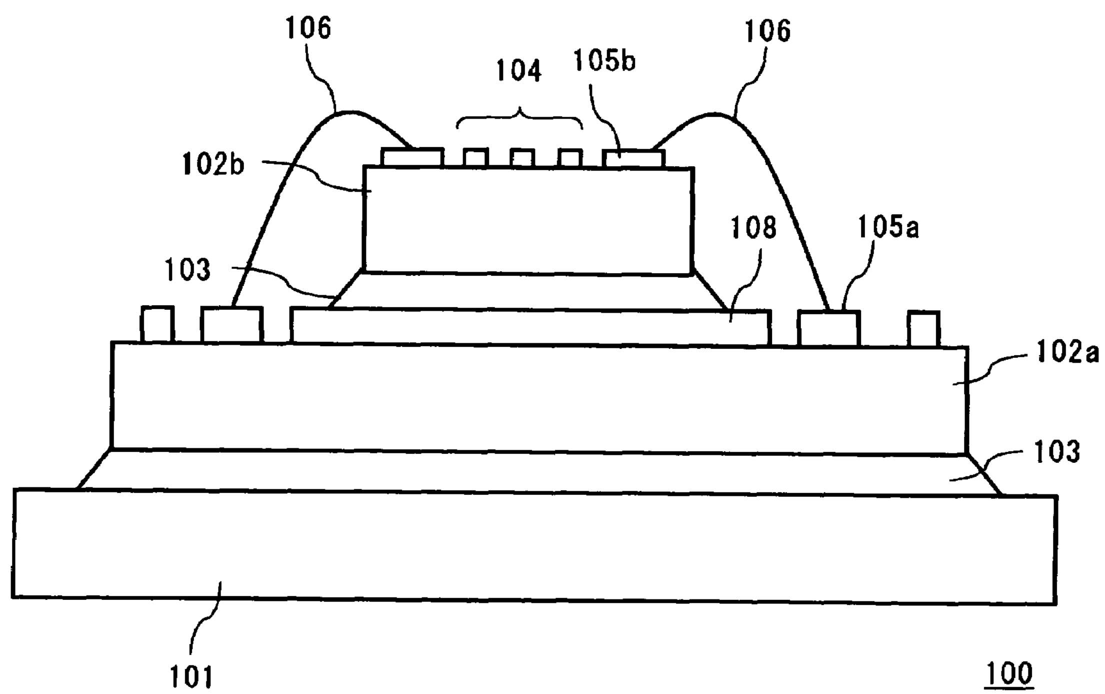
FIG. 4 is a schematic diagram showing the structure of a semiconductor device according to a second embodiment of the present invention.
Figure 5:
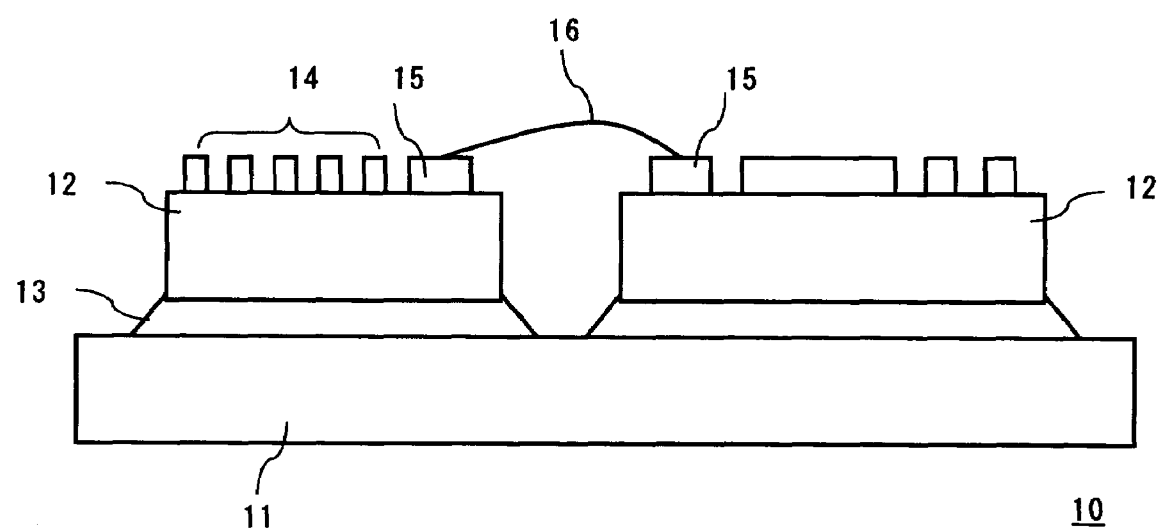
FIG. 5 is a schematic diagram showing the structure of a conventional semiconductor device.

Referring to FIG. 4, a semiconductor device according to a second embodiment of the present invention is described. FIG. 4 is a schematic diagram showing the structure of the multi-chip module 100 as the semiconductor device of this embodiment. This embodiment differs from the first embodiment in that the second semiconductor chip 102*b* is mounted onto the first semiconductor chip 102*a* connected onto the lead frame 101. In FIG. 4, the same components as those of the first embodiment are denoted by like reference numerals and their description is omitted.

In the multi-chip module 100 according to this embodiment, an island (not shown) connected with the first semiconductor chip 102*a* is formed on the lead frame 101. The first semiconductor chip 102*a* is connected face up onto the island through the die mounting member 103.

Formed on the first semiconductor chip 102*a* are the circuit wiring line 104 and the first bonding pad 105*a* formed in the previous step. Further, an island 108 connected with the second semiconductor chip 102*b* is formed on the first semiconductor chip 102*a*.

The second semiconductor chip 102*b* is connected face up onto the island 108 of the first semiconductor chip 102*a* through the die mounting member 103. The second semiconductor chip 102*b* has a chip size small enough not to cover the bonding pad 105*a* formed on the first semiconductor chip 102*a*. Formed on the second semiconductor chip 102*b* are the circuit wiring line 104 and the second bonding pad 105*b*. Further, the second bonding pad 105*b* is thinner than the first bonding pad 105*a*.

The first bonding pad 105*a* is electrically connected with the second bonding pad 105*b* through the bonding wire 106. As mentioned above, after bonding the thick first bonding pad 105*a* with the bonding wire 106, the second bonding pad 105*b* is bonded to prevent the semiconductor chips 102 from being damaged.

Accordingly, the circuit wiring line 104 of the second semiconductor chip 102*b* can be made thin to improve the integration degree of the second semiconductor chip 102*b*. Accordingly, for example, the first semiconductor chip 102*a* can be used as an output chip that needs to have the thick circuit wiring line for withstanding a large amount of current. In addition, the second semiconductor chip 102*b* can be used as a control circuit chip that needs to have the thin circuit wiring line for improving the integration degree. Thus, a manufacturing cost can be reduced to improve the integration degree of the multi-chip module 100.

The present invention is applicable to a multi-chip module where the semiconductor chips 102 are stacked three-dimensionally.

Incidentally, this embodiment describes the example where the second bonding pad 105*b* of the second semiconductor chip 102*b* mounted on the first semiconductor chip 102*a* is made thinner than the first bonding pad 105*a*, but the present Invention is not limited thereto. By changing the bonding order, the first bonding pad 105*a* of the first semiconductor chip 102*a* underlying the second semiconductor chip 102*b* may be thinner than the second bonding pad 105*b*. That is, in the multi-chip module where the chips are tree-dimensionally stacked, whichever of the upper semiconductor chip and the lower semiconductor chip is selected, the bonding pad on the second bond side can be made thin.

Further, it is needless to say that the present invention is applicable to a package having plural islands.

As set forth above, in consideration of the bonding order upon the bonding between the semiconductor chips 102 with the bonding wire 106 of the multi-chip module 100, the bonding pad 105 connected with one of the semiconductor chips 102 can be formed with the smaller thickness at low costs. Accordingly, a line pitch of the circuit wiring lines 104 of the semiconductor chips 102 can be reduced, and thus the semiconductor chips 102 can be downsized with ease. This contributes to production of the semiconductor device of the high integration degree and small size.

It is apparent that the present invention is not limited to the above embodiment and it may be modified and changed without departing from the scope and spirit of the invention.

What is claimed is:

1. A semiconductor device, comprising:

a first semiconductor chip having a first bonding pad, the first bonding pad having a first thickness;

a second semiconductor chip having a second bonding pad, the second bonding pad having a second thickness thinner than the first thickness; and a bonding wire connected between the first and second bonding pads.

2. The semiconductor device according to claim 1, wherein the bonding wire is metal containing Al.

3. The semiconductor device according to claim 1, wherein the first semiconductor chip comprises an output chip, and the second semiconductor chip comprises a control circuit chip.

4. The semiconductor device according to claim 3, wherein the first semiconductor chip includes a power MOS transistor.

5. The semiconductor device according to claim 1, wherein an external force applied to the second bonding pad upon bonding the second bonding pad to the bonding wire is smaller than an external force applied to the first bonding pad upon bonding the first bonding pad to the bonding wire.

6. The semiconductor device according to claim 1, further comprising a lead frame on which the first and second semiconductor chips are mounted, respectively.

7. The semiconductor device according to claim 1, further comprising a lead frame on which the first and second semiconductor chips are mounted, wherein the second semiconductor chip is mounted on the first semiconductor chip.

8. The semiconductor device according to claim 1, wherein the second bonding pad is bonded to the bonding wire after the first bonding pad is bonded to the bonding wire.

9. The semiconductor device according to claim 1, wherein an end of the bonding wire at the second bonding pad side has a structure which is torn off.

10. The semiconductor device according to claim 1, further comprising a substrate, wherein the first semiconductor chip is mounted on the substrate, the first semiconductor chip further comprises a first circuit wiring line thereon, and the first circuit wiring line has the first thickness;

wherein a second semiconductor chip is mounted on the substrate, the second semiconductor chip further comprises a plurality of second circuit wiring lines thereon, and the plurality of second circuit wiring lines have the second thickness thinner than the first thickness.

11. The semiconductor device according to claim 10, wherein the first semiconductor chip includes a power MOS transistor and the second semiconductor chip comprises a control circuit controlling the first semiconductor chip.

12. The semiconductor device according to claim 11, wherein the second bonding pad is bonded to the bonding wire after the first bonding pad is bonded to the bonding wire.

13. The semiconductor device according to claim 11, wherein an end of the bonding wire at the second bonding pad side has a structure which is torn off.

14. The semiconductor device according to claim 13, wherein the first semiconductor chip includes a power MOS transistor and the second semiconductor chip comprises a control circuit controlling the first semiconductor chip.

15. The semiconductor device according to claim 10, wherein the bonding wire is bonded to the first second bonding pads with a wedge bonded method.

16. The semiconductor device according to claim 1, further comprising a substrate;

wherein the first semiconductor chip is mounted on the substrate, the first semiconductor chip further comprises a first circuit wiring line thereon, and the first circuit wiring line has the first thickness; and wherein a second semiconductor chip is mounted on the first semiconductor chip, the second semiconductor chip further comprises a plurality of second circuit wiring lines thereon, and the plurality of second circuit wiring lines have the second thickness thinner than the first thickness.

* * * * *